United States Patent
Alugbin et al.

[11] Patent Number: 5,851,870
[45] Date of Patent: Dec. 22, 1998

[54] METHOD FOR MAKING A CAPACITOR

[75] Inventors: Dayo Alugbin, Windmere; Chung Wai Leung, Orlando; Joseph Rudolph Radosevich, Orlando; Ranbir Singh, Orlando; Daniel Mark Wroge, Orlando, all of Fla.

[73] Assignee: Lucent Technologies Inc., Murray Hill, N.J.

[21] Appl. No.: 644,086

[22] Filed: May 9, 1996

Related U.S. Application Data

[63] Continuation of Ser. No. 353,015, Dec. 9, 1994, Pat. No. 5,576,240.

[51] Int. Cl.⁶ .................................................. H01L 21/8242
[52] U.S. Cl. ........................ 438/239; 438/250; 438/253
[58] Field of Search ............ 437/60, 919; 438/238–239, 438/250–256, 381, 393–398

[56] References Cited

U.S. PATENT DOCUMENTS

| | | | |
|---|---|---|---|
| 4,731,696 | 3/1988 | Himes et al. | 361/313 |
| 5,005,102 | 4/1991 | Larson | 361/313 |
| 5,057,447 | 10/1991 | Paterson | 437/43 |
| 5,065,220 | 11/1991 | Paterson | 357/51 |
| 5,086,370 | 2/1992 | Yasaitis | 361/313 |
| 5,108,941 | 4/1992 | Paterson et al. | 437/47 |
| 5,195,017 | 3/1993 | McDonald | 361/313 |
| 5,244,825 | 9/1993 | Coleman et al. | 437/52 |
| 5,290,729 | 3/1994 | Hayashide et al. | 437/60 |
| 5,300,450 | 4/1994 | Shen et al. | 437/52 |
| 5,304,506 | 4/1994 | Porter et al. | 437/60 |
| 5,312,769 | 5/1994 | Matsuo et al. | 437/52 |
| 5,326,724 | 7/1994 | Wei | 437/200 |
| 5,338,701 | 8/1994 | Hsu et al. | 437/60 |
| 5,340,765 | 8/1994 | Dennison et al. | 437/52 |
| 5,374,578 | 12/1994 | Patel et al. | 437/52 |
| 5,418,388 | 5/1995 | Okudaira et al. | 257/295 |

OTHER PUBLICATIONS

Multiple layer ceramic plate with embedded conductive layers Hitachi KK 19.06.81—JP–093877; V01 (V04).

*Primary Examiner*—Jey Tsai
*Attorney, Agent, or Firm*—Anthony Grillo

[57] ABSTRACT

A novel capacitor design for use in semiconductor integrated circuits is disclosed. The capacitor includes a metal-dielectric-metal stack formed within a window and upon a conductive substrate. Contact to the top plate of the capacitor is through a window within a window, while contact to the bottom plate is achieved by a guard ring which contacts the conductive substrate.

2 Claims, 4 Drawing Sheets

METHOD FOR MAKING A CAPACITOR

CROSS-REFERENCE TO RELATED APPLICATION

This application is a continuation in part of application Ser. No. 08/353,015 filed Dec. 9, 1994, now U.S. Pat. No. 5,576,240.

TECHNICAL FIELD

The present invention relates to a method for fabricating a capacitor, and more particularly, to a method for fabricating a metal to metal capacitor in an integrated circuit.

BACKGROUND OF THE INVENTION

Capacitors are used extensively in electronic devices for storing an electric charge. The capacitors essentially comprise two conductive plates separated by an insulator. The capacitance, or amount of charge held by the capacitor per applied voltage, is measured in farads and depends upon the area of the plates, the oxide thickness between them, and the dielectric constant of the insulator. Capacitors are used in filters, in analog-to-digital converters (ADCs), in memories, and various control applications.

Capacitors in integrated circuits are usually fabricated from polysilicon, metal to polysilicon or metal to polycide structures. In most applications, such as in analogue to digital converters (ADC's), one needs capacitors whose capacitance does not vary with voltage. A measure of the variation of capacitance with applied voltage is called the voltage coefficient of capacitance (VoC) measured in parts per million. Generally, VoC of capacitors used on integrated circuits is not zero (50–300 ppm) and hence needs to be nulled. Circuit techniques that employ null methods assume that the variation of VoC with voltage, while not zero, is a linear function of voltage, which is not a valid assumption in integrated circuit capacitors. Furthermore, while these techniques increase precision and resolution of ADC's they consume chip area, and hence increase chip cost. If the VoC of the capacitors is less than a few ppm one does not need to employ null circuit techniques, thereby reducing circuit complexity and cost.

U.S. Pat. No. 5,108,941 to Paterson et al. discloses a method of making a metal to polysilicon type capacitor having a low VoC as compared to polysilicon type capacitors. In the Paterson et al. method the bottom plate of the capacitor is formed over a field oxide structure, and the multilevel dielectric is deposited thereover. The multilevel dielectric is removed from the capacitor area, and an oxide/nitride dielectric is deposited over the exposed bottom plate and over the multilevel by way of low pressure chemical vapor deposition ("LPCVD"). A first layer of titanium/tungsten is preferably deposited prior to contact etch, and the contacts to moat and unrelated polysilicon are formed. Metallization is sputtered overall, and the metal and titanium/tungsten are cleared to leave the metallization filling the contact holes, and a capacitor having a titanium/tungsten and metal top plate.

In any fabrication process, simplicity is an advantage. Thus, a fabrication method which can achieve the same or better quality product with the same cost of materials while using fewer steps is highly preferred, especially if elimination of fabrication steps reduces labor costs and the need for expensive manufacturing equipment. A new structure built from materials already being used in the fabrication process is preferred since it reduces materials development efforts and the need for expensive manufacturing equipment.

Moreover, it is desirable to have flexibility in the processing steps for fabricating integrated circuits. Particularly, it is highly advantageous to have a modular process for forming a capacitor, i.e. a process that can be added as an option to an existing digital process with no changes in sequence operations. Employing a silicided metal on polysilicon ("polycide") as contemplated in U.S. Pat. No. 5,108,941 entails siliciding the entire polysilicon layer to achieve the optimum voltage stability. However, siliciding sharply reduces processing flexibility. For example, with a silicided structure heat treatment of the integrated circuit for such purposes as annealing, diffusion, driving in dopants, smoothing interlevel dielectrics and the like, is limited to temperatures below about 850° C. It would be advantageous to be able to use temperatures above 850° C. and to be able to form low VoC capacitors at various stages of integrated circuit fabrication.

SUMMARY OF THE INVENTION

These and other concerns are advantageously addressed by the present invention which include formation of a capacitor by:

forming a conductive substrate;

forming a patterned dielectric upon the substrate, the patterned dielectric having an opening which exposes the substrate, the opening having at least one side;

forming at least one conductive material within the opening, the conductive material contacting the substrate and not contacting the sides of the opening;

forming a dielectric upon the conducting material, the dielectric not contacting the sides of the opening; and forming a conductive layer upon the dielectric layer, the conductive top layer not contacting the sides of the opening.

BRIEF DESCRIPTION OF THE DRAWING

So that one skilled in the art to which the subject invention appertains will better understand how to practice the method of the present invention, preferred embodiments of the method will be described in detail hereinbelow with reference to the drawings wherein.

DETAILED DESCRIPTION

Figure 1:
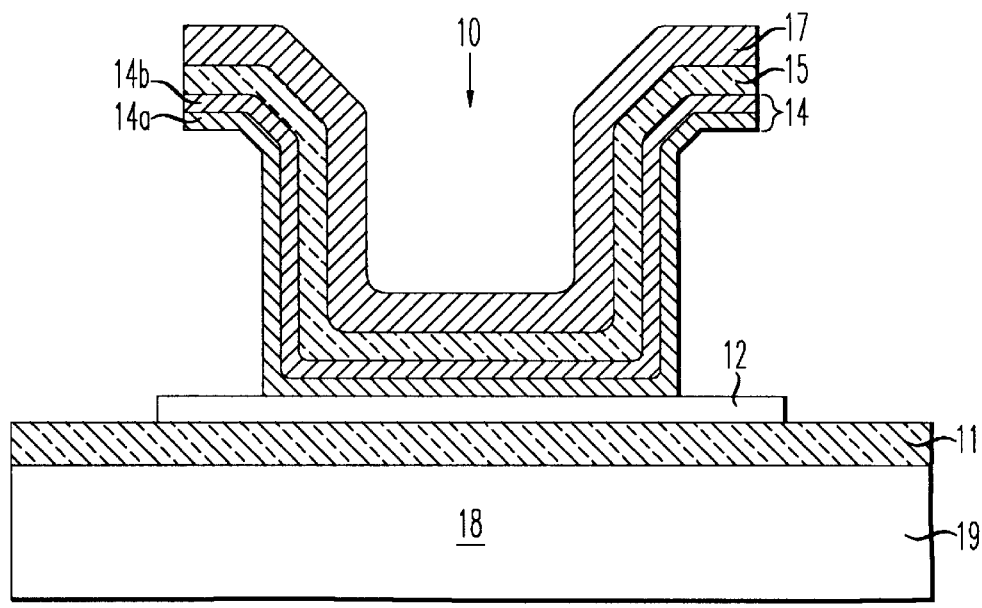
FIG. 1 is a cross-sectional diagram of the capacitor 10 of one embodiment of the present invention.

FIG. 1 is a cross-sectional diagram of the metal to metal capacitor 10 constructed according to the method described herein. The capacitor 10 comprises a lower plate 14, dielectric layer 15, and upper plate 17. These layers are optionally stacked on top of a polycrystalline silicon ("polysilicon") layer 12, which is formed on top of field oxide ("FOX") dielectric layer 11 disposed on a silicon substrate 18. The substrate 18 may be a p-type or n-type silicon.

Lower plate 14 of the capacitor 10 can be formed from any metal suitable for conducting and holding an electric charge, such as aluminum, copper, silver, titanium, or noble metals such as gold, platinum, palladium, and the like. Preferably, lower plate 14 is a multilayered structure comprising layer 14a of titanium (Ti) overcoated with layer 14b of titanium nitride (TiN). Layer 14 may range in thickness from about 0.04 microns to about 0.15 microns, with the Ti layer 14a ranging in thickness from about 0.01 microns to about 0.05 microns, and the TiN layer ranging in thickness from about 0.03 microns to about 0.10 microns.

Layer 15 can be formed from any suitable dielectric, such as silicon dioxide ($SiO_2$) and/or silicon nitride and can generally range in thickness from about 0.01 microns to about 0.10 microns depending on the electrical requirements of the capacitor.

The top plate 17 of the capacitor can be any metal suitable for fabricating capacitors on integrated circuits. Aluminum is a preferred metal for fabricating top plate 17. The aluminum may optionally be doped with, for example, copper or silicon, or alternatively may be part of a multilayered metal system.

Figure 2:
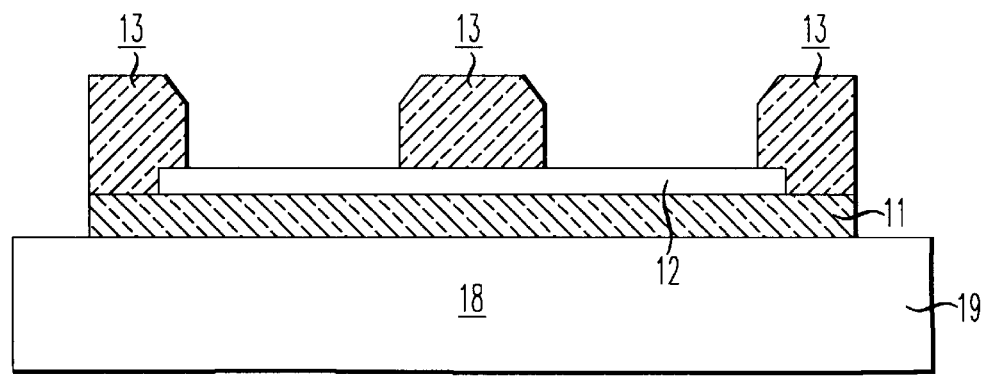
FIGS. 2–6 are cross-sectional diagrams illustrating various steps in the formation of the capacitor FIG. 1.

The method of making a metal to metal capacitor 10 having a very low VoC is illustrated in FIGS. 2–6. Referring to FIG. 2, a plate of polysilicon 12 is patterned over a layer 11 of field oxide ($SiO_2$). The field oxide layer 11 is formed on the silicon substrate 18 in a manner well known in the art, such as local oxidation or by deposition. Likewise, patterning of polysilicon is well known in the art. Then, interlevel dielectrics 13 are deposited in an appropriate pattern to insulate the polysilicon layer 12 from overlying metallization. The interlevel dielectric 13 is preferably silicon dioxide, which may optionally be doped, or may optionally also be silicon nitride or any other material having properties suitable for the use described herein. The structure at this point is as diagrammed in FIG. 2. Alternatively, layer 11 may represent a higher level dielectric instead of a field oxide. In other words, layer 11 may be a dielectric, formed illustratively from a chemical precursor, over one or more layers of conductive runners and other dielectrics.

The polysilicon 12 is preferably heavily doped to be relatively conductive, as in conventional integrated circuits. Generally, the polysilicon layer will be n-doped either by diffusion, ion implantation, or by in-situ doping. It should be noted that polysilicon layer 12 does not serve as the bottom plate of capacitor 10 and hence is optional. However, it serves as a lead to conduct electric charge to and from the bottom layer 14 and thereby facilitates the incorporation of capacitor 10 into an integrated circuit. In contrast to the method disclosed in U.S. Pat. No. 5,108,941 the polysilicon layer 12 herein does not need to be silicided to achieve optimum VoC performance of the capacitor 10. Moreover, other conductive materials may be substituted for polysilicon over dielectric 11, such as aluminum, copper, silver, titanium, or noble metals such as gold, platinum, palladium, and the like.

Figure 3:
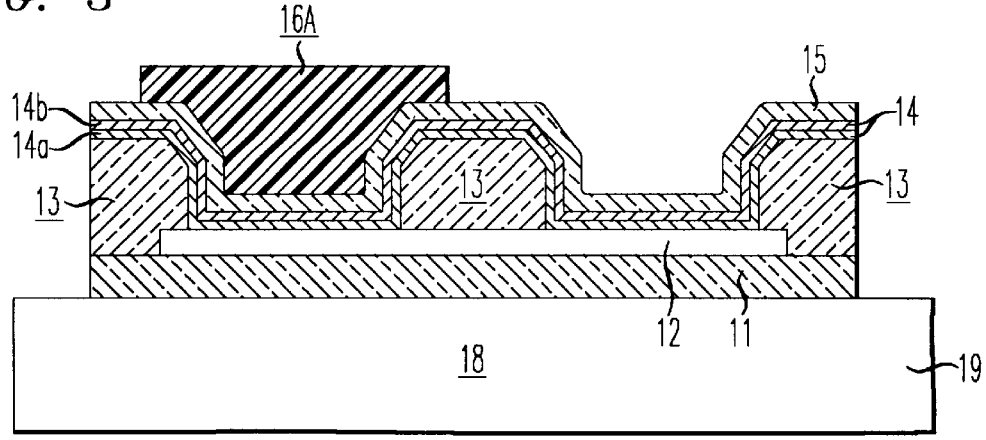

Referring to FIG. 3, a bottom plate 14 is formed by depositing a layer 14a of titanium (Ti) and 14b of titanium nitride (TiN), preferably by sputter deposition. The titanium nitride may be deposited in-situ after a certain thickness of titanium metal has been deposited by bleeding nitrogen gas into the titanium sputtering chamber. Thus, the titanium nitride forms a coating which covers the titanium and serves as an etch stop for later processing steps as discussed below.

Next, the capacitor dielectric 15 is deposited. The dielectric is formed by first depositing tetraethoxysilane ("TEOS") on the layer 14 of Ti/TiN by means of chemical vapor deposition ("CVD") or plasma enhanced chemical vapor deposition ("PECVD"). The TEOS decomposes to form an adherent layer 15 of $SiO_2$. Although the capacitor dielectric is described herein as being silicon dioxide, it should be understood that other materials can also function as capacitor dielectrics. For example, the capacitor dielectric 15 can be formed from silicon nitride or ferroelectric material such as $BaTiO_3$. Following this, the capacitor is then masked using a photoresist 16a, which is used to delineate the edges of the capacitor 10. The structure at this point is as diagrammed in FIG. 3.

Figure 4:
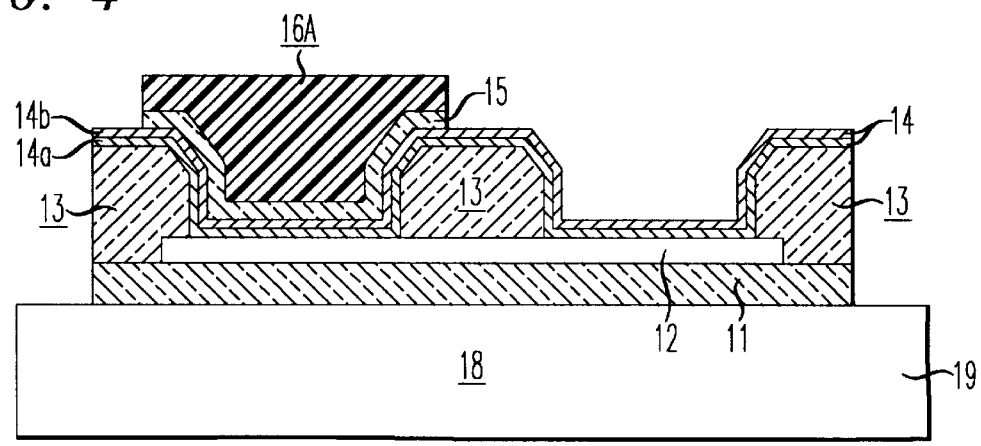
Figure 5:
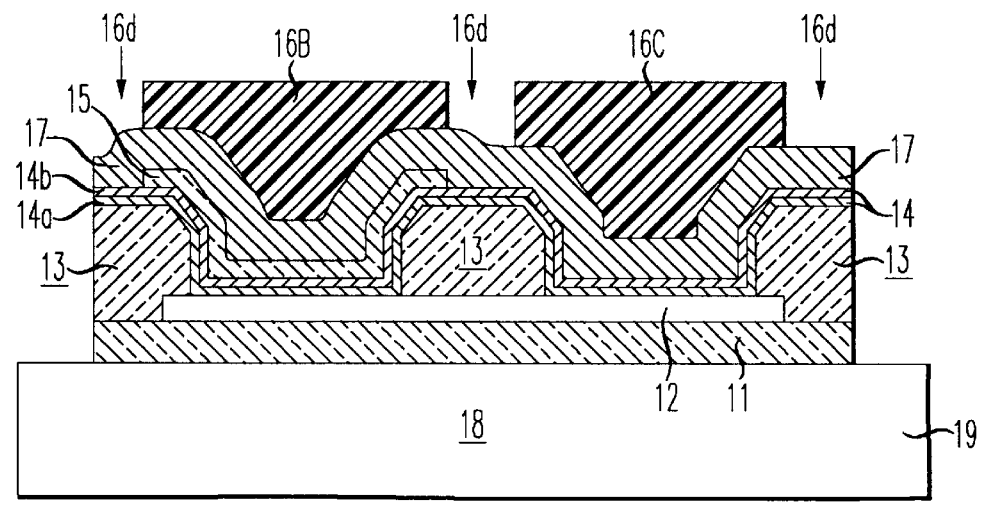

Referring to FIG. 4, capacitor dielectric layer 15 is etched away with, for example, when the dielectric is silicon dioxide, a wet etch such as ethylene glycol/buffered hydrogen fluoride solution, or a dry etch such as reactive sputter etching. The TiN is resistant to such etches and functions as an etch stop. The structure at this point is as diagrammed in FIG. 4.

In the next step the photoresist 16a is stripped off and a layer 17 of aluminum ("Al") is deposited. The capacitor 10 is formed in the areas with the remaining capacitor dielectric in which the capacitor layers are titanium—titanium nitride—silicon dioxide (or other dielectric)—aluminum.

Next, the aluminum layer 17 is patterned with masking material, i.e. photoresist portions 16b and 16c, which are exposed and developed in accordance with conventional photolithography techniques to define gaps 16d for exposing the surface of the integrated circuit to an etchant. The photoresist portion 16b, which defines the limits of the capacitor 10, should terminate on the oxide 15. The resulting structure is as diagrammed in FIG. 5.

Figure 6:
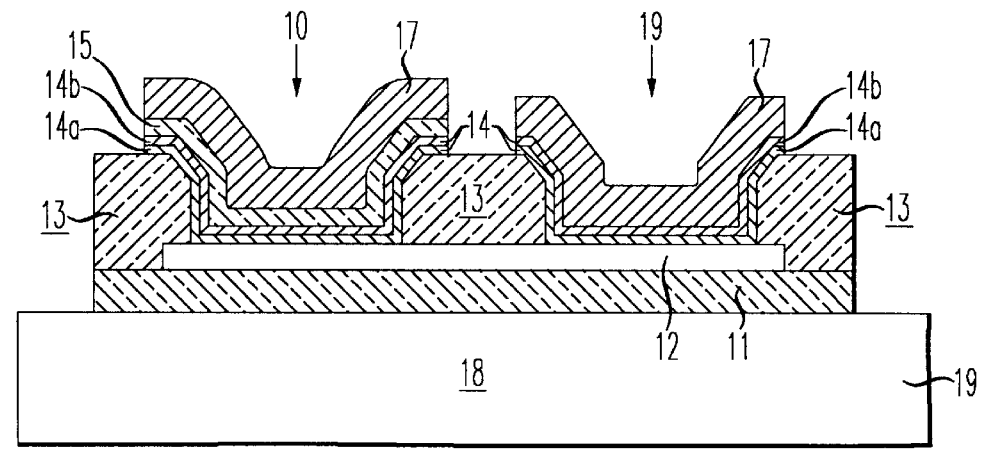

Finally, the aluminum is over-etched sufficiently to remove dielectric 15 and the titanium—titanium nitride underlayer 14 positioned at the gaps 16d. Then the photoresist portions 16b and 16c are stripped. The resulting structure is as shown in FIG. 6. Structure 19 is a contact via containing conductive layers of aluminum 17 and Ti/TiN 14 provides electrical access to bottom plate 14 of the capacitor 10 through the polysilicon layer 12.

Figure 7:
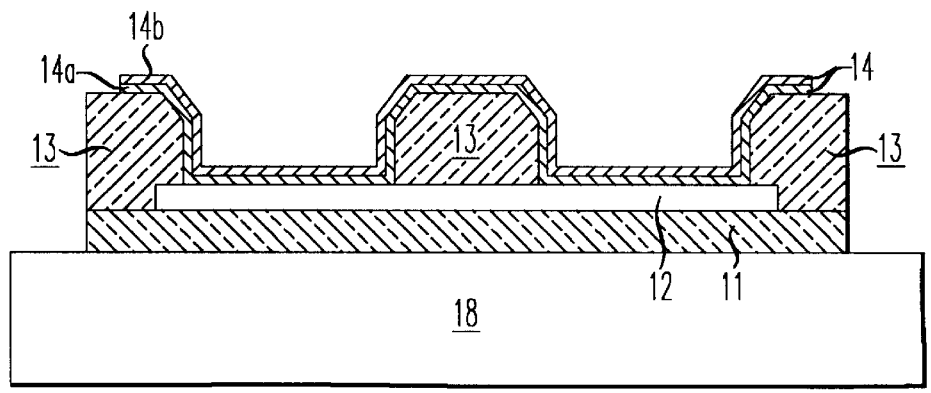
FIGS. 7–10 are a cross-sectional diagrams of another illustrative embodiment of the present invention.

FIGS. 7–10 depict another embodiment of the present invention. In FIG. 7, a plate of polysilicon 12 is patterned over a layer 11 of field oxide $SiO_2$. Interlevel dielectric has been deposited and patterned in a manner similar to that already described. Interlevel dielectric 13 is preferably silicon dioxide which may be optionally doped or may optionally also be silicon nitride or any other suitable material.

Polysilicon 121 is preferably heavily doped to be relatively conductive as in conventional integrated circuits. However, in contrast to the previous embodiment, the presence of polysilicon layer 121 (or another suitable conductive material) is important to the proper functioning of this embodiment of the invention. Other conductive materials may be substituted for polysilicon, such as aluminum, copper, silver, titanium, or noble metals such as gold, platinum, pallidium, and like.

A bottom plate 14 is formed by depositing a layer 14a of titanium and 14b of titanium nitride, preferably by sputter deposition. The titanium nitride may be deposited, as before, in-situ after a certain thickness of titanium metal has been deposited by bleeding nitrogen gas into the titanium sputtering chamber.

Figure 8:
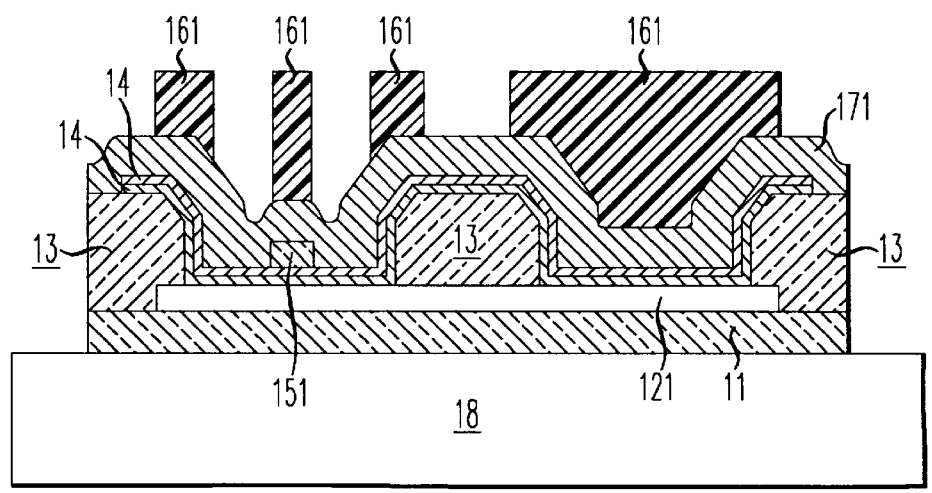

Turning to FIG. 8, capacitor dielectric 151 is deposited and patterned. In the embodiment of FIG. 8, capacitor dielectric 151 is deposited along only the floor of the trench defined by patterned dielectric 13. In other words, unlike the previous embodiment, capacitor dielectric 151 does not extend up along the sides of the trench. The only contact between capacitor dielectric 151 and bottom plate 14 is at the bottom of the trench. Capacitor dielectric 151 may, illustratively, be formed from a variety of dielectrics, such as plasma enhanced TEOS, silane oxide, silicon oxynitride and silicon nitride. Applicant's investigations have indicated that silane oxide (deposited at a low temperature of approximately 400°–410° C.) is preferable because it exhibits the best thickness uniformity (site to site, wafer to wafer, and lot to lot) good breakdown voltage and low particle counts. Furthermore, as can be appreciated from examination of FIG. 8, whatever dielectric is chosen, there must exist good etching selectivity between that dielectric and the underlying bottom plate 14. Illustratively, the thickness of dielectric oxide 151 is 400–500 Å.

A layer of metal, 171, is next deposited. If desired, metal 171 may be covered by a variety of conductive layers such as titanium and/or titanium nitride. Then photoresist 161 is deposited and patterned. As it can be appreciated from an examination of FIG. 8, photoresist 161 is patterned so that portions of both metal conductor 171 and bottom plate 14 will be exposed to the etching process.

Figure 9:
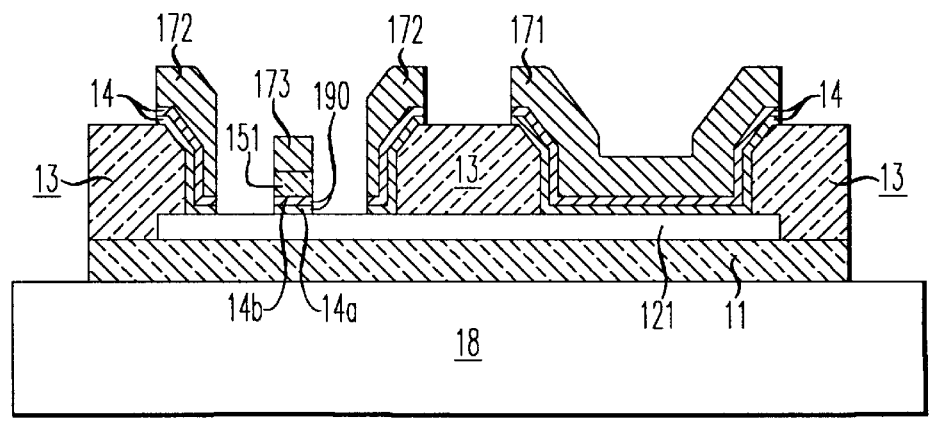

After the etching process has been performed, the structure of FIG. 9 is obtained. It will be noted, as before, on the right side of FIG. 9, a window contact has been made to polysilicon 121. The window contact comprises patterned metal 171 and titanium nitride/titanium 14. On the left side portion of FIG. 9, a capacitor comprising patterned metal 173 (top plate) dielectric 151, and patterned bottom plate 14*a* and 14*b* has been defined. Furthermore, a guard ring comprising patterned metal 72 together with titanium nitride/titanium bilayer 14 surrounds the capacitor, contacting both the bottom of the trench and the sidewalls of the trench defined by patterned dielectric 13. However, as mentioned before, it will noted that the capacitor itself has comparatively horizontal upper and lower plates (with dielectric sandwiched therebetween) and does not extend along the sidewalls of the trench defined by patterned dielectric 13. The guard ring defined by metal 172 and titanium nitride/titanium conductor 14 serves to prevent sodium passivation by gettering sodium. Furthermore, the conductive guard ring contacts conductive polysilicon 121 and thereby also contacts the lower plate designated by reference numeral 190 of the capacitor.

Figure 10:
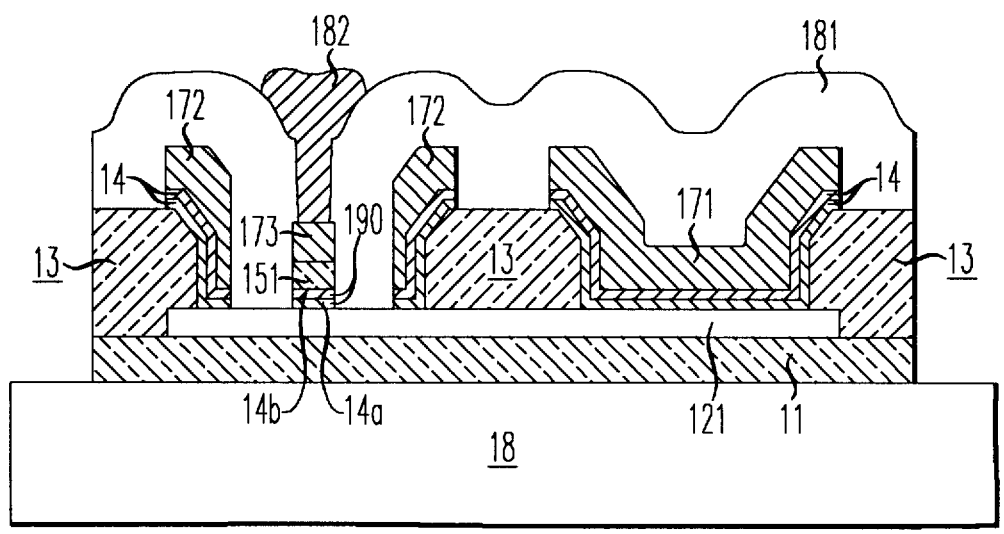

In FIG. 10, dielectric 181, which may illustratively, be formed from TEOS, or another suitable precursor has been deposited and patterned. A patterned opening above upper plate 173 of the capacitor has been formed and filled with conductive material 182, illustratively, aluminum. Thus, contact to the upper plate 173 of the capacitor is achieved through conductor 182, while contact to the lower plate 190 of the capacitor is achieved through conductive polysilicon 121 and guard ring 172-14.

Although the subject invention has been described with respect to preferred embodiments, it will be readily apparent to those having ordinary skill in the art to which it appertains that changes and modifications may be made thereto without departing from the spirit or scope of the subject invention as defined by the appended claims.

We claim:

1. A method for forming a capacitor comprising:

forming a conductive substrate;

forming a patterned dielectric upon said substrate, said patterned dielectric having an opening which exposes said substrate, said opening having at least one side;

forming at least one conductive material within said opening; said conductive material contacting said substrate and not contacting said sides of said opening;

forming a dielectric upon said conductive material, said dielectric not contacting said sides of said opening;

forming a conductive top layer upon said dielectric layer, said conductive top layer not contacting said sides of said opening.

2. A method of forming a capacitor comprising:

forming a substrate of conductive polysilicon;

forming a patterned dielectric upon said polysilicon; said patterned dielectric having a window exposing said polysilicon, said window having sides;

depositing a layer of titanium upon said dielectric and in said window and contacting said polysilicon; depositing a layer of layer of titanium nitride upon said layer of titanium said layers of titanium and titanium nitride, termed herein a bilayer; said bilayer having sides which contact said sides of said window and having a bottom which contacts said polysilicon;

depositing a blanket layer of silicon dioxide upon said bilayer;

patterning said layer of silicon dioxide so that said layer of silicon dioxide contacts said bottom of said bilayer and does not contact said sides of said bilayer;

depositing a blanket layer of aluminum, said blanket layer of aluminum contacting sides of said bilayer and contacting said patterned layer of silicon dioxide;

patterning said aluminum layer and said bilayer to expose said conductive polysilicon, a portion of said aluminum layer remaining on top of said layer of silicon dioxide and a portion of said aluminum layer remaining on top of said sides of said bilayers.

* * * * *